(12) United States Patent
Lu et al.

(10) Patent No.: US 11,367,731 B2
(45) Date of Patent: Jun. 21, 2022

(54) MEMORY DEVICE AND METHOD OF MANUFACTURING THE SAME

(71) Applicant: TAIWAN SEMICONDUCTOR MANUFACTURING COMPANY LTD., Hsinchu (TW)

(72) Inventors: Hau-Yan Lu, Hsinchu (TW); Chun-Yao Ko, Hsinchu (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 49 days.

(21) Appl. No.: 16/136,863

(22) Filed: Sep. 20, 2018

(65) Prior Publication Data

US 2019/0164982 A1    May 30, 2019

Related U.S. Application Data

(60) Provisional application No. 62/590,459, filed on Nov. 24, 2017.

(51) Int. Cl.
*H01L 29/423* (2006.01)
*H01L 27/11524* (2017.01)
(Continued)

(52) U.S. Cl.
CPC ...... *H01L 27/11524* (2013.01); *H01L 27/108* (2013.01); *H01L 27/1156* (2013.01); *H01L 27/11519* (2013.01); *H01L 27/11558* (2013.01)

(58) Field of Classification Search
CPC .................................................. H01L 29/42332
See application file for complete search history.

(56) References Cited

U.S. PATENT DOCUMENTS

| 2007/0296020 A1 | 12/2007 | Shiba et al. |
| 2009/0267127 A1 | 10/2009 | Chen et al. |

(Continued)

FOREIGN PATENT DOCUMENTS

| CN | 107039448 A | 8/2017 |
| EP | 2312624 B1 | 9/2012 |
| TW | I582959 B | 5/2017 |

OTHER PUBLICATIONS

Office Action and Search Report dated Aug. 31, 2020 issued by China Intellectual Property Office for counterpart application No. 201811398183.1.

(Continued)

*Primary Examiner* — Moazzam Hossain
*Assistant Examiner* — Hajar Kolahdouzan
(74) *Attorney, Agent, or Firm* — WPAT, P.C., Intellectual Property Attorneys; Anthony King

(57) ABSTRACT

A memory device is disclosed. The memory device includes: a first memory cell, including: a first transistor; a second transistor; and a first capacitor; a second memory cell, including: a third transistor; a fourth transistor; and a second capacitor; a third memory cell, including: a fifth transistor; a sixth transistor; and a third capacitor; and a fourth memory cell, including: a seventh transistor; an eighth transistor; and a fourth capacitor; wherein an electrode of the first capacitor, an electrode of the second capacitor, an electrode of the third capacitor, and an electrode of the fourth capacitor are electrically connected to a conductor. An associated manufacturing method is also disclosed.

20 Claims, 8 Drawing Sheets

(51) Int. Cl.
    *H01L 27/108*     (2006.01)
    *H01L 27/1156*     (2017.01)
    *H01L 27/11558*     (2017.01)
    *H01L 27/11519*     (2017.01)

(56) References Cited

U.S. PATENT DOCUMENTS

| | | | | |
|---|---|---|---|---|
| 2014/0293709 | A1* | 10/2014 | Kwon | G11C 16/0441 |
| | | | | 257/315 |
| 2015/0287438 | A1 | 10/2015 | Chen et al. | |
| 2016/0260727 | A1* | 9/2016 | Tsao | H01L 29/7835 |
| 2017/0194338 | A1 | 7/2017 | Chen et al. | |

OTHER PUBLICATIONS

Office Action and Search Report dated Jun. 1, 2020 issued by Taiwan Intellectual Property Office for counterpart application No. 107141960.

Office Action, Cited Reference and Search Report dated Mar. 19, 2021 issued by the China National Intellectual Property Administration for counterpart application No. 201811398183.1.

Office Action, Cited Reference and Search Report dated Aug. 3, 2021 issued by the Taiwan Intellectual Property office for the Taiwanese Counterpart Application No. 109144324.

\* cited by examiner

MEMORY DEVICE AND METHOD OF MANUFACTURING THE SAME

CROSS REFERENCE TO RELATED APPLICATIONS

This application claims the benefit of U.S. provisional application 62/590,459, filed on Nov. 24, 2017, which is incorporated by reference in its entirety.

BACKGROUND

In deep sub-micron integrated circuit technology, non-volatile memory device has become a popular storage unit due to various advantages. Particularly, the data saved in the non-volatile memory device are not lost when the power is turned off. One particular example of the non-volatile memory device includes a single floating gate to retain the electrical charges associated with the saved data. When the integrated circuit including non-volatile memory device is scaled down through various technology nodes, the design of the memory device have a consideration of the process integration, such as alignment margin and other factors, leading to large memory cell size and low packing density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
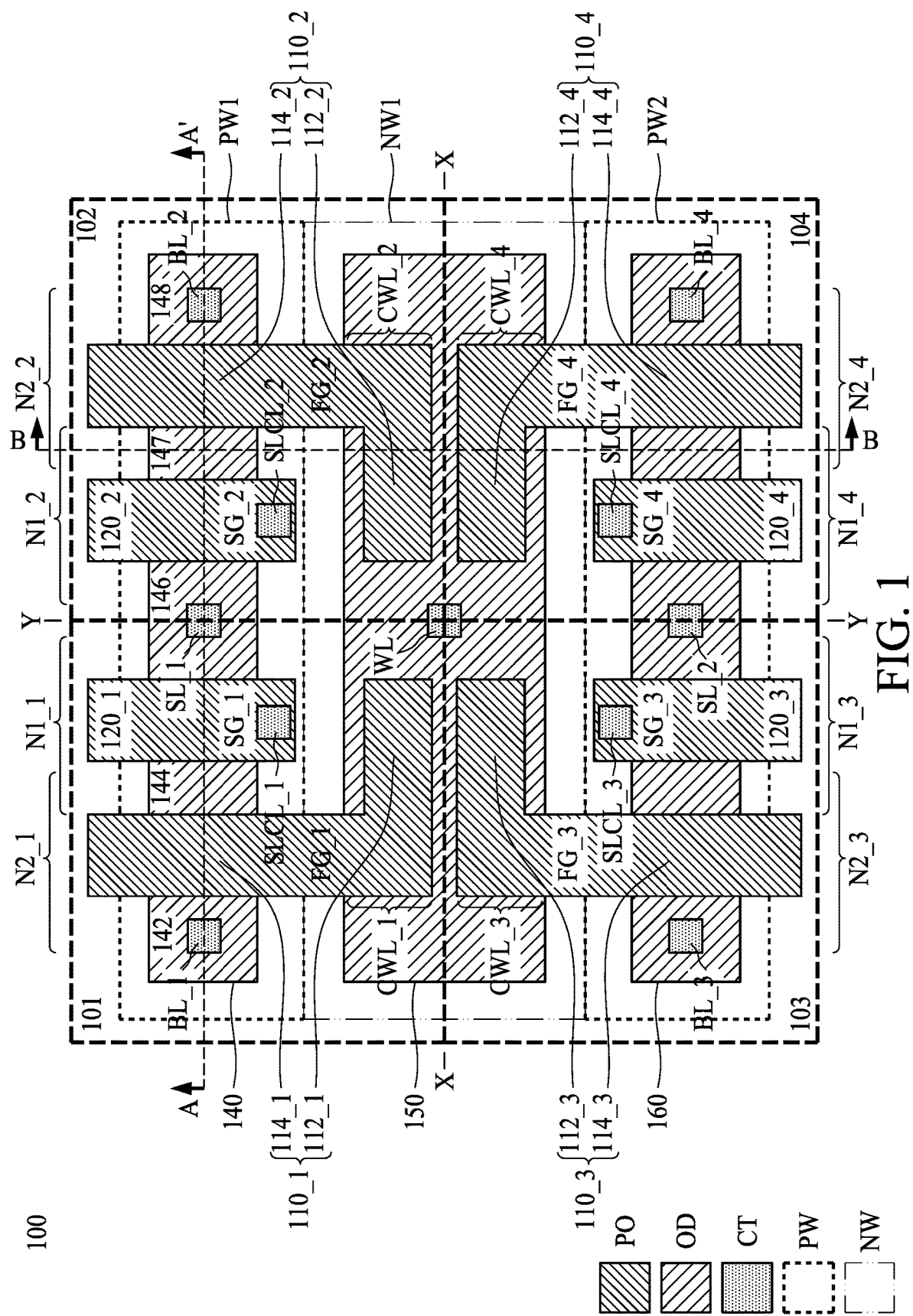
FIG. 1 is a layout of a memory device, in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a layout of a memory device 100, in accordance with some embodiments of the present disclosure. The semiconductor device 100 includes at least one memory cell. In particular, four memory cells 101, 102, 103 and 104 are shown in FIG. 1, for example. In the example configuration in FIG. 1, the memory cell 101 and the memory cell 102 are symmetrical with each other across the axis Y; the memory cell 103 and the memory cell 104 are symmetrical with each other across the axis Y; the memory cell 101 and the memory cell 103 are symmetrical with each other across the axis X; the memory cell 102 and the memory cell 104 are symmetrical with each other across the axis X. Other arrangements are within the scope of various embodiments. In particular, conductive patterns of the memory cell 101 and the memory cell 102 commonly form two half crimp grips facing toward a same direction; and conductive patterns of the memory cell 103 and the memory cell 104 commonly form two half crimp grips facing toward a same direction.

The memory cell 101 includes conductive patterns 110_1 and 120_1, and active area patterns 140 and 150. The conductive patterns 110_1 and 120_1 are discrete one from another. The conductive pattern 110_1 (also referred to herein as floating gate FG_1) extends continuously over the active area patterns 140 and 150. The conductive pattern 110_1 includes a first portion 114_1 at least over the active area pattern 140, and a second portion 112_1 at least over the active area pattern 150. The conductive pattern 120_1 (also referred to herein as selector gate SG_1) extends over the active area pattern 140. In at least one embodiment, the conductive pattern 110_1 and the conductive pattern 120_1 belong to the same layer of conductive material. An example material of the conductive pattern 110_1 and conductive pattern 120_1 is polysilicon. Other materials are within the scope of various embodiments. The conductive pattern 110_1 and conductive pattern 120_1 of the memory cell 101, and corresponding conductive patterns (e.g., floating gates FG_2, FG_3 and FG_4) of the memory cells 102, 103 and 104 are schematically illustrated in FIG. 1 with the label "PO."

The active area patterns 140 and 150 are discrete one from another. The active area patterns 140 and 150 and corresponding active area pattern 160 are also referred to herein as "OD patterns," i.e., oxide-diffusion (OD) regions, and are schematically illustrated in FIG. 1 with the label "OD." Example materials of the active area patterns 140 and 150 include, but are not limited to, semiconductor materials doped with various types of p-dopants and/or n-dopants. In at least one embodiment, the active area patterns 140 and 150 include dopants of the same type. In at least one embodiment, the active area patterns 140 and 150 include dopants of different type. The active area patterns 140 and 150 are within corresponding well regions. In the example configuration in FIG. 1, the active area pattern 140 is within a well region PW1 which is a p-well, and the active area pattern 150 is within a well region NW1 which is an n-well. The described conductivity of the well regions is an example. Other arrangements are within the scope of various embodiments. The n- and p-wells are schematically illustrated in FIG. 1 with the corresponding labels "NW1", "PW1" and "PW2."

The active area pattern 140 has a type of dopants different in type from that of the corresponding well region PW1. For example, the active area pattern 140 includes n-type dopants, and the corresponding well region PW1 includes p-type dopants. The active area pattern 140, the well region PW1, and the conductive pattern 120_1 extending over the well region PW1 are configured to form a transistor N1_1, which is a selector transistor of the memory cell 101. The active area pattern 140, the well region PW1, and the first portion 114_1 of the conductive pattern 110_1 extending over the well region PW1 are configured to form a transistor N2_1, which is a storage transistor of the memory cell 101. Examples of the transistors N1_1 and N2_1 include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, etc. In at least one embodiment, the transistors N1_1 and N2_1 are n-channel metal-oxide semiconductor (NMOS) transistors. In at least one embodiment, the transistors N1_1 and N2_1 are p-channel metal-oxide semiconductor (PMOS) transistors.

The first portion 114_1 of the conductive pattern 110_1 and the conductive pattern 120_1 divide the active area pattern 140 into regions 142, 144 and 146. The regions 144 and 146 of the active area pattern 140 are arranged on opposite sides of the conductive pattern 120_1, and are configured to form corresponding drain D1_1 and source S1_1 of the transistor N1_1. A gate G1 of the transistor N1_1 is configured by the conductive pattern 120_1. A conductor SLCL_1 is arranged in the conductive pattern 120_1 to provide an electrical connection from the gate G1 of the transistor N1_1 to a selector line, for programming and/or reading memory cell 101. A conductor SL_1 (also referred to herein as a source line SL_1) is arranged in the region 146 to provide an electrical connection from the source S1_1 of the transistor N1_1 to a source line, for programming and/or reading memory cell 101.

The regions 142 and 144 of the active area pattern 140 are arranged on opposite sides of the second portion 114_1 of the conductive pattern 110_1, and are configured to form corresponding drain D2_1 and source S2_1 of the transistor N2_1. A gate G2 of the transistor N2_1 is a floating gate configured by the second portion 114_1 of the conductive pattern 110_1. A conductor BL_1 (also referred to herein as a bit line BL_1) is arranged in the region 142 to provide an electrical connection from the drain D2_1 of the transistor N2_1 to a bit line, for programming and/or reading memory cell 101. The region 144 of the active area pattern 140 is arranged between the gates G1 and G2 of the transistors N1_1 and N2_1, and is configured to form both the drain D1_1 of the transistor N1_1 and the source S2_1 of the transistor N2_1. As a result, the transistor N1_1 and transistor N2_1 are serially coupled.

The active area pattern 150 has the same type of dopants as the corresponding well region NW1. For example, both the active area pattern 150 and the corresponding well region NW1 include n-type dopants. The active area pattern 150 and the well region NW1 having the same type of dopants are configured to form a first electrode of a capacitor CWL_1. A second electrode of the capacitor CWL_1 is configured by the second portion 112_1 which extends over the active area pattern 150 and well region NW1. The second portion 112_1 overlaps the active area pattern 150 and well region NW1 in an overlapping area which determines a capacitance of the capacitor CWL_1. A conductor WL (also referred to herein as a word line WL) is arranged in the active area pattern 150 to provide an electrical connection from the first electrode of the capacitor CWL_1 to a word line, for reading and/or programming the memory cell 101. The conductors SLCL_1, SL_1, BL_1, WL of the memory cell 101 and corresponding conductors (e.g., SLCL_2, BL_2, SLCL_3, SL_2, BL_3, SLCL_4, and BL_4) of the memory cells 102, 103 and 104 are schematically illustrated in FIG. 1 with the label "CT." In the example configuration in FIG. 1, the well region PW1 shares a border with the well region NW1.

As mentioned above, according to an exemplary embodiment, the memory cell 101 and the memory cell 102 are symmetrical with each other with respect to the axis Y; the memory cell 103 and the memory cell 104 are symmetrical with each other across the axis Y; the memory cell 101 and the memory cell 103 are symmetrical with each other across the axis X; the memory cell 102 and the memory cell 104 are symmetrical with each other across the axis X. Conductive patterns 110_2 and 120_2 of the memory cell 102 may be symmetrical with the conductive patterns 110_1 and 120_1 of the memory cell 101 across the axis Y. Conductive patterns 110_3 and 120_3 of the memory cell 103 may be symmetrical with the conductive patterns 110_1 and 120_1 of the memory cell 101 across the axis X. Conductive patterns 110_4 and 120_4 of the memory cell 104 may be symmetrical with the conductive patterns 110_2 and 120_2 of the memory cell 102 across the axis X. Conductive patterns 110_3 and 120_3 of the memory cell 103 may be symmetrical with the conductive patterns 110_4 and 120_4 of the memory cell 104 across the axis Y.

Conductors SLCL_2 and BL_2 of the memory cell 102 may be symmetrical with the conductors SLCL_1 and BL_1 of the memory cell 101 across the axis Y. Conductors SLCL_3 and BL_3 of the memory cell 103 may be symmetrical with the conductors SLCL_1 and BL_1 of the memory cell 101 across the axis X. Conductors SLCL_4 and BL_4 of the memory cell 104 may be symmetrical with the conductors SLCL_2 and BL_2 of the memory cell 102 across the axis X. Conductors SLCL_3 and BL_3 of the memory cell 103 may be symmetrical with the conductors SLCL_4 and BL_4 of the memory cell 104 across the axis Y.

The well region PW1 is shared by the memory cells 101 and 102. In particular, the well region PW1 continuously extends from the memory cell 101 to memory cell 102 without being separated by, for example, an isolation structure. The active area pattern 140, the well region PW1, and the conductive pattern 120_2 extending over the well region PW1 are configured to form a transistor N1_2, which is a selector transistor of the memory cell 102. In some embodiments, the conductor SL_1 may be disposed between and shared by the memory cells 101 and 102 to provide an electrical connection from the source S1_1 of the transistor N1_1 and a source S1_2 of the transistor N1_2 to a source line. In other words, the source S1_1 of the transistor N1_1 and the source S1_2 of the transistor N1_2 are electrically coupled to each other. In addition, the active area pattern 140, the well region PW1, and the conductive pattern 110_2 extending over the well region PW1 are configured to form a transistor N2_2, which is a storage transistor of the memory cell 102.

In a similar way, the well region PW2 is shared by the memory cells 103 and 104. In particular, the well region PW2 continuously extends from the memory cell 103 to memory cell 104 without being separated by, for example, an isolation structure. The active area pattern 160, the well region PW2, and the conductive pattern 120_3 extending over the well region PW2 are configured to form a transistor N1_3, which is a selector transistor of the memory cell 103. The active area pattern 160, the well region PW2, and the conductive pattern 120_4 extending over the well region PW2 are configured to form a transistor N1_4, which is a selector transistor of the memory cell 104. In some embodiments, the conductor SL_2 may be disposed between and shared by the memory cells 103 and 104 to provide an electrical connection from a source S1_3 of the transistor N1_3 and a source S1_4 of the transistor N1_4 to a source line. In other words, the source S1_3 of the transistor N1_3 and the source S1_4 of the transistor N1_4 are electrically coupled to each other. In addition, the active area pattern 160, the well region PW2, and the conductive pattern 110_3 extending over the well region PW2 are configured to form a transistor N2_3, which is a storage transistor of the memory cell 103. The active area pattern 160, the well region PW2, and the conductive pattern 110_4 extending over the well region PW2 are configured to form a transistor N2_4, which is a storage transistor of the memory cell 104.

As shown in FIG. 1, the well region NW1 is shared by the memory cells 101, 102, 103, and 104. In particular, the well region NW1 continuously extends from the memory cell 101 to memory cells 102, 103, and 104 without being separated by, for example, an isolation structure. The second portion 112_2 overlaps the active area pattern 150 and well region NW1 in an overlapping area which determines a capacitance of a capacitor CWL_2 of the memory cell 102. The second portion 112_3 overlaps the active area pattern 150 and well region NW1 in an overlapping area which determines a capacitance of a capacitor CWL_3 of the memory cell 103. The second portion 112_4 overlaps the active area pattern 150 and well region NW1 in an overlapping area which determines a capacitance of a capacitor CWL_4 of the memory cell 104. The first electrode of the capacitor CWL_1 is formed by the active area pattern 150 and the well region NW1 as mentioned above. Since the well region NW1 is shared by the capacitors CWL_1, CWL_2, CWL_3, and CWL_4. The first electrode of the capacitor CWL_1 may be shared by the capacitors CWL_1, CWL_2, CWL_3, and CWL_4 as well.

A conductor WL (also referred to herein as a word line WL) is arranged in the active area pattern 150 to provide an electrical connection from the first electrode of the capacitors CWL_1, CWL_2, CWL_3, and CWL_4 to a word line, for reading and/or programing the memory cells 101, 102, 103, and 104. A second electrode of the capacitor CWL_2 is configured by the second portion 112_2 which extends over the active area pattern 150 and well region NW1. A second electrode of the capacitor CWL_3 is configured by the second portion 112_3 which extends over the active area pattern 150 and well region NW1. A second electrode of the capacitor CWL_4 is configured by the second portion 112_4 which extends over the active area pattern 150 and well region NW1. Since the conductor WL is shared by the memory cells 101, 102, 103, and 104, the conductor WL may be configured to be at an intersection of the axis X and the axis Y.

Figure 2:
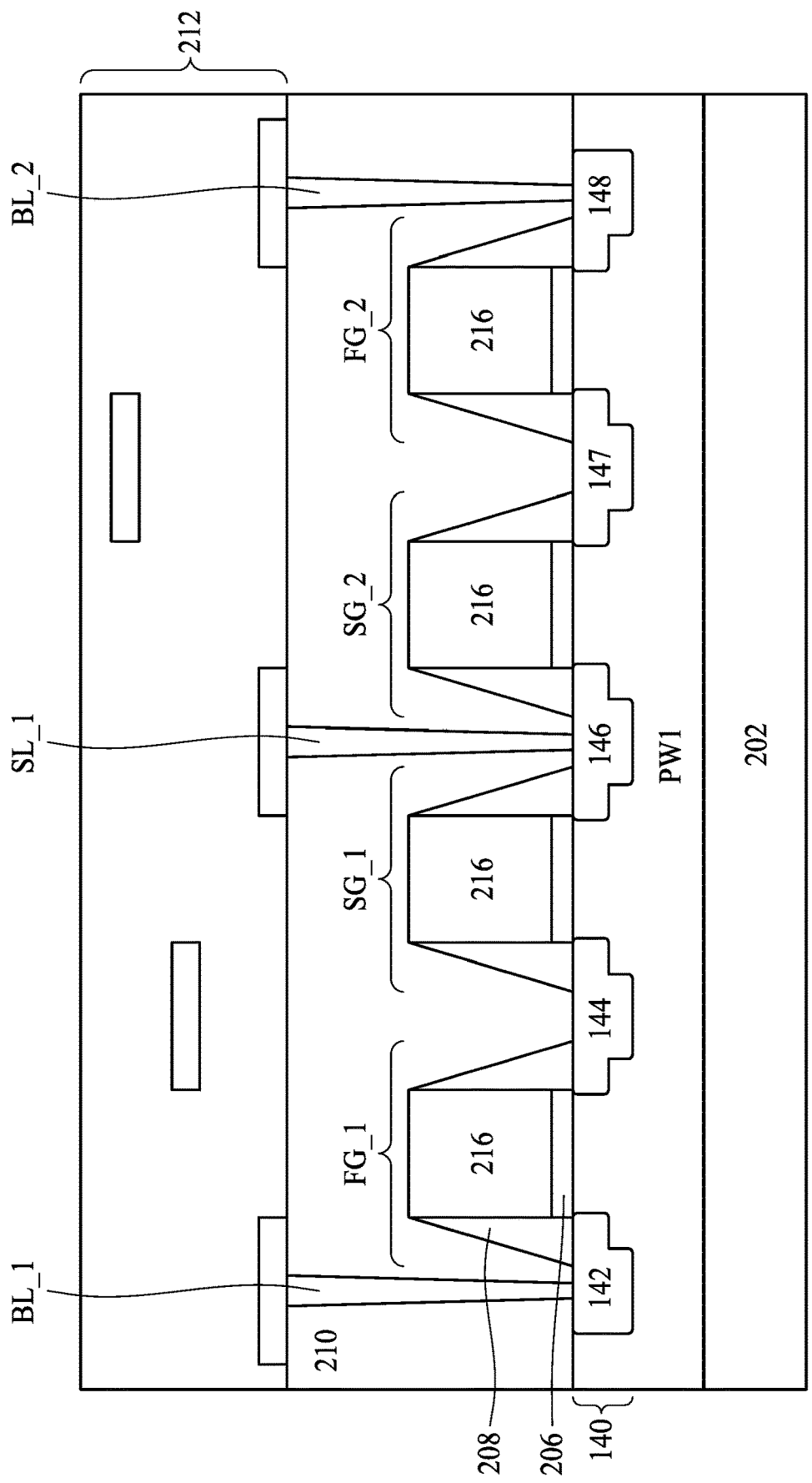
FIG. 2 is a cross-sectional diagram of the memory device of FIG. 1 taken along a line AA' in accordance with some embodiments of the present disclosure.

FIG. 2 is a cross-sectional diagram of the memory device 100 of FIG. 1 taken along a line AA' in accordance with some embodiments of the present disclosure. The memory device 100 includes a semiconductor substrate 202. Example materials of the semiconductor substrate 202 include, but are not limited to, silicon germanium (SiGe), gallium arsenic, or other suitable semiconductor materials. In at least one embodiment, the semiconductor substrate 202 is a p-type substrate. Specifically, the well regions PW1, NW1, and PW2 are in the semiconductor substrate 202, and only the well region PW1 is shown in FIG. 2. The active area pattern 140 is in the well region PW1. The active area pattern 140 including regions 142, 144, 146, 147, and 148 with n-type dopants. The first portions 114_1 of the floating gate FG_1 and the first portions 114_2 of the floating gate FG_2 are over the well region PW1. The selector gates SG_1 and SG_2 are over the well region PW1 as well. The floating gates FG_1 and FG_2 and the selector gates SG_1 and SG_2 belong to the same conductive layer, which, in at least one embodiment, includes a single polysilicon layer over the semiconductor substrate 202. In some embodiment, gate oxide layers 206 may be between the semiconductor substrate 202 and the single polysilicon layer, and the floating gates FG_1 and FG_2 and the selector gates SG_1 and SG_2 may further include gate spacers (or sidewall spacers) 208. The region 142 is coupled to the bit line BL_1; the region 146 is coupled to the source line SL_1; and the region 148 is coupled to the bit line BL_2.

Example materials of the gate oxide layer 206 include, but are not limited to, a high-k dielectric layer, an interfacial layer, and/or combinations thereof. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2→Al2O3)

alloy, other suitable high-k dielectric materials, and/or combinations thereof. In some embodiments, the memory device 100 further includes a plurality of metal layers disposed within an interconnect structure 212.

Figure 3:
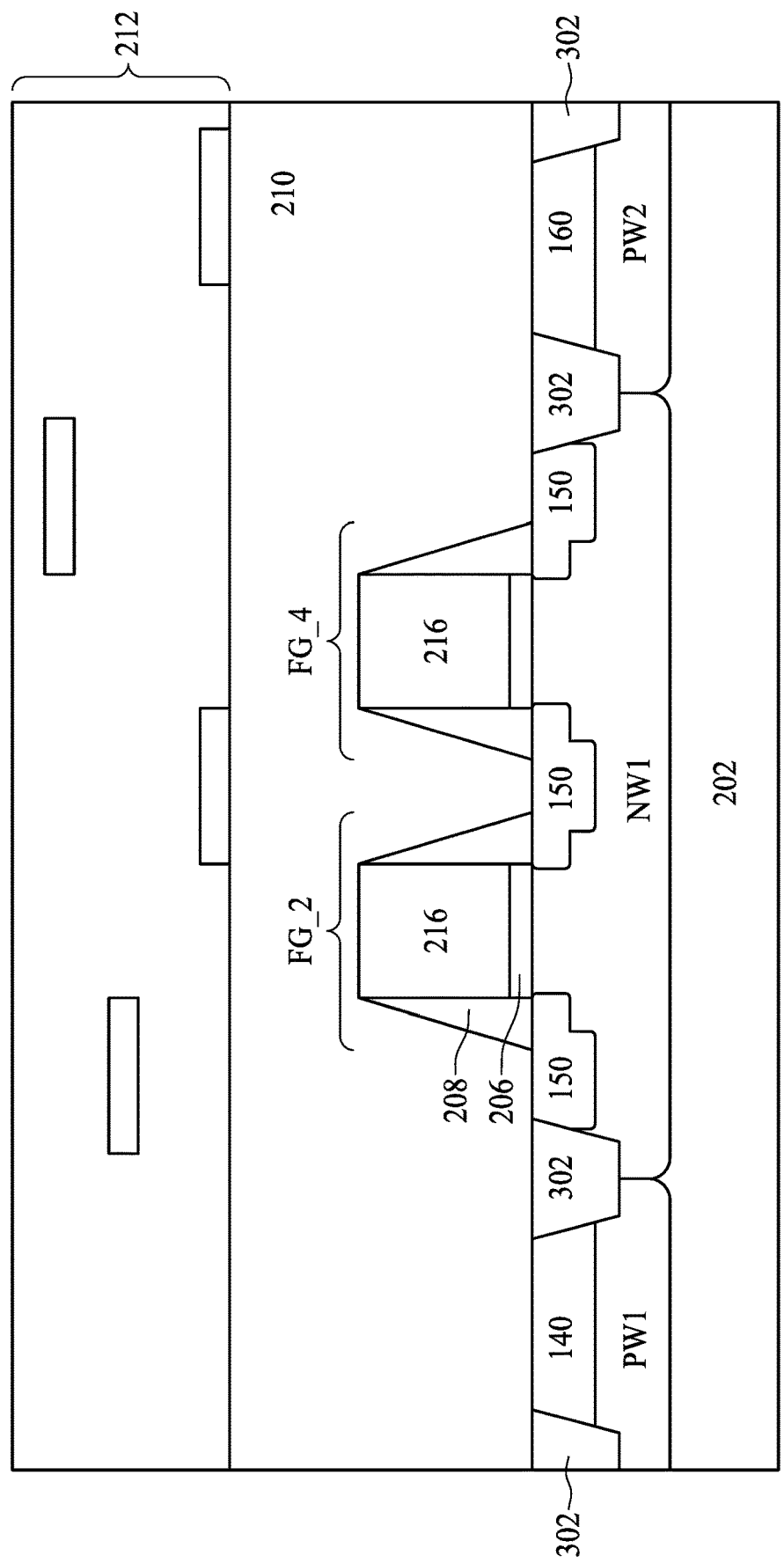
FIG. 3 is a cross-sectional diagram of the memory device of FIG. 1 taken along a line BB' in accordance with some embodiments of the present disclosure.

FIG. 3 is a cross-sectional diagram of the memory device 100 of FIG. 1 taken along a line BB' in accordance with some embodiments of the present disclosure. The well regions PW1, NW1, and PW2 are in the semiconductor substrate 202 as shown in FIG. 3. The active area pattern 140 is in the well region PW1; the active area pattern 150 is in the well region NW1; and the active area pattern 160 is in the well region PW2. The active area patterns 140, 150, and 160 include n-type dopants. The second portions 112_2 of the floating gate FG_2 and the second portions 112_4 of the floating gate FG_4 are over the well region NW1. The floating gates FG_2 and FG_4 belong to the same conductive layer, which, in at least one embodiment, includes a single polysilicon layer over the semiconductor substrate 202. In some embodiment, the gate oxide layers 206 may be between the semiconductor substrate 202 and the single polysilicon layer, and the floating gates FG_2 and FG_4 may further include gate spacers (or sidewall spacers) 208. In some embodiments, the memory device 100 further includes the interconnect structure 212. In one or more embodiments, isolation structures 302, such as a shallow trench isolation (STI) region, may be formed between the well region PW1 and the well region NW1 and/or between the well region PW2 and the well region NW1.

Figure 4:
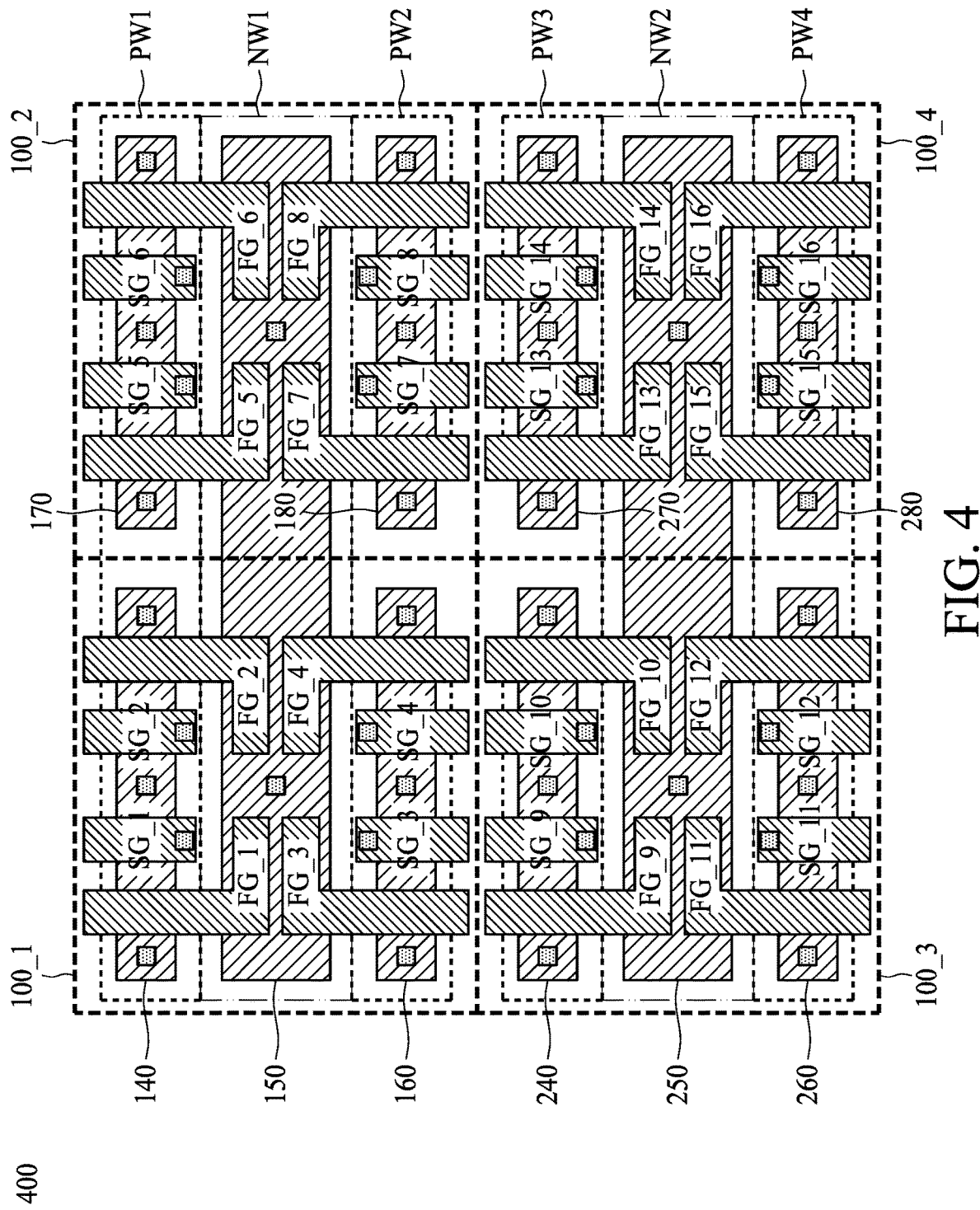
FIG. 4 is a layout of a memory device, in accordance with some embodiments of the present disclosure; and FIG. 5 to FIG. 8 illustrates the cross-sectional diagrams of intermediate stages in the formation of the memory device in accordance with various embodiments of the present disclosure.

FIG. 4 is a layout of a memory device 400, in accordance with some embodiments of the present disclosure. The memory device 400 is comprised of four memory devices 100_1, 100_2, 100_3, and 100_4. Each of the memory devices 100_1, 100_2, 100_3, and 100_4 are substantially the same to the memory device 100 of FIG. 1. The four memory devices 100_1, 100_2, 100_3, and 100_4 are arranged in a 2×2 memory device array. The memory devices 100_1 and 100_2 share the well regions PW1, NW1, and PW2. The active area pattern 140 of the memory devices 100_1 and an active area pattern 170 of the memory devices 100_2 are discrete one from another. The active area pattern 160 of the memory devices 100_1 and an active area pattern 180 of the memory devices 100_2 are discrete one from another. In particular, the memory devices 100_1 and 100_2 share the well region NW1. In other words, the well region NW1 extends continuously across the memory devices 100_1 and 100_2 without being divided by any isolation structure.

The memory devices 100_3 and 100_4 share the well regions PW3, NW2, and PW4. The active area pattern 240 of the memory devices 100_3 and an active area pattern 270 of the memory devices 100_4 are discrete one from another. The active area pattern 260 of the memory devices 100_3 and an active area pattern 280 of the memory devices 100_4 are discrete one from another. In particular, the memory devices 100_3 and 100_4 share the well region NW2. In other words, the well region NW2 extends continuously across the memory devices 100_3 and 100_4 without being divided by any isolation structure. In addition, gates FG_1 to FG_16 and SG_1 to SG_16 are discrete one from another. The memory devices may further extend along any direction in various embodiments.

FIG. 5 to FIG. 8 illustrates the cross-sectional diagrams of intermediate stages in the formation of the memory device 100 in accordance with various embodiments of the present disclosure. Each of FIG. 5 to FIG. 8 includes two cross-sectional diagram of the memory device 100. The cross-sectional diagrams at the left side of FIG. 5 to FIG. 8 represent the intermediate stages in the formation of the cross-sectional diagram of FIG. 2. The cross-sectional diagrams at the right side of FIG. 5 to FIG. 8 represent the intermediate stages in the formation of the cross-sectional diagram of FIG. 3.

Figure 5:
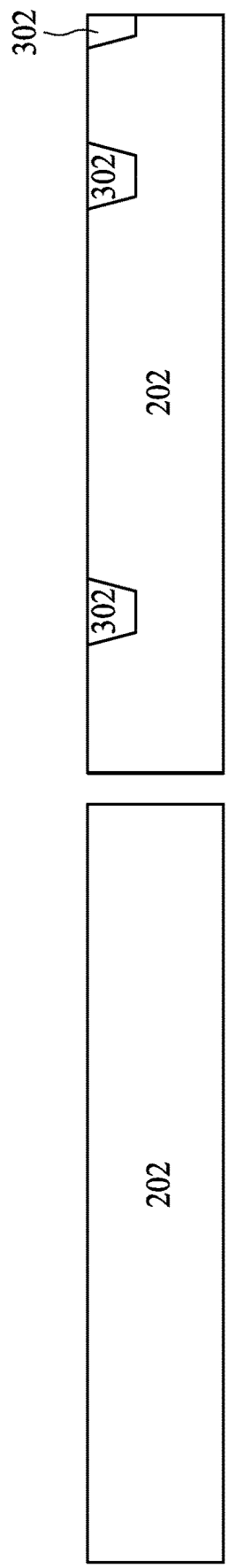

Referring to FIG. 5, the semiconductor substrate 202 is provided. The semiconductor substrate 202 includes the isolation structures 302 formed in the substrate to separate various devices going to be formed. The formation of the isolation structures 302 may include etching a trench in the semiconductor substrate 202 and filling the trench by insulator materials such as silicon oxide, silicon nitride, or silicon oxynitride. The filled trench may have a multi-layer structure such as a thermal oxide liner layer with silicon nitride filling the trench. In one embodiment, the isolation structures 302 may be created using a process sequence such as: growing a pad oxide, forming a low pressure chemical vapor deposition (LPCVD) nitride layer, patterning an opening using photoresist and masking, etching a trench in the substrate, optionally growing a thermal oxide trench liner to improve the trench interface, filling the trench with CVD oxide, using chemical mechanical planarization (CMP) to etch back.

Figure 6:
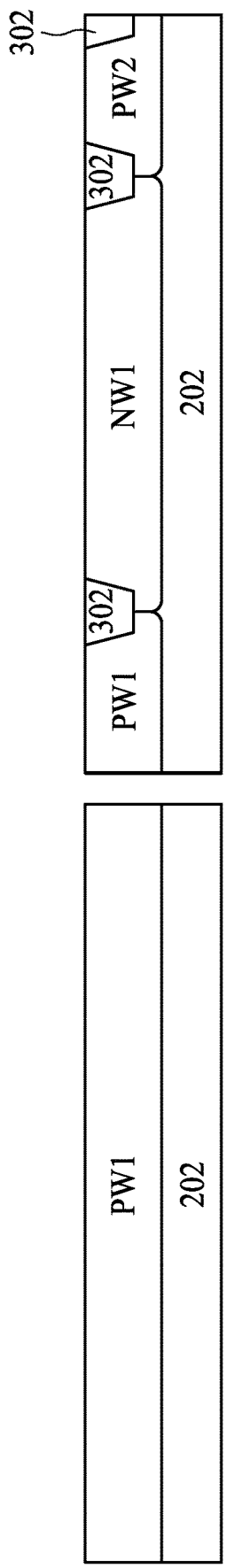
Figure 7:
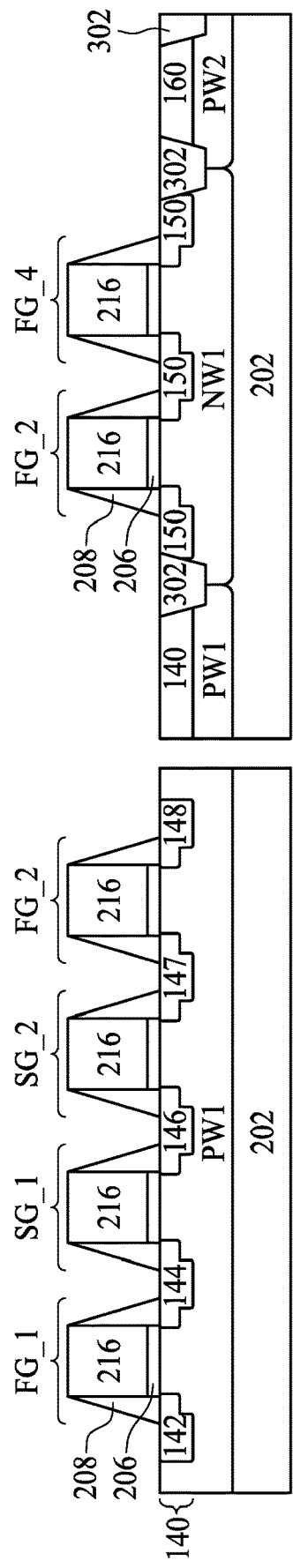

In FIG. 6, various doped regions such as the well regions PW1, NW1, and PW2 are formed in the semiconductor substrate 202. As shown in FIG. 6, the isolation structures 302 are between the well regions PW1, NW1, and PW2 to provide enough spacing between the well regions PW1 and NW1 and between the well regions PW2 and NW1. Referring to FIG. 7, the floating gates FG_1 to FG_4 and selector gates SG_1 to SG_4 may be simultaneously formed in a same processing procedure. Various doped features including regions 140 (including regions 142, 144, 146, 147, and 148), 150, and 160 with n-type dopants are formed in the semiconductor substrate 202 by a proper technique, such as one or more ion implantations. In some embodiments, the regions 140, 150, and 160 may include light doped regions substantially aligned with associated gate stacks 216 and heavily doped regions substantially aligned with associated gate spacers 208. In furtherance of the embodiment, the light doped regions may be formed first by ion implantation with a light doping dose. Thereafter, the gate spacers 208 are formed by dielectric deposition and plasma etching. Then the heavily doped regions are formed by ion implantation with a heavy doping dose.

Figure 8:
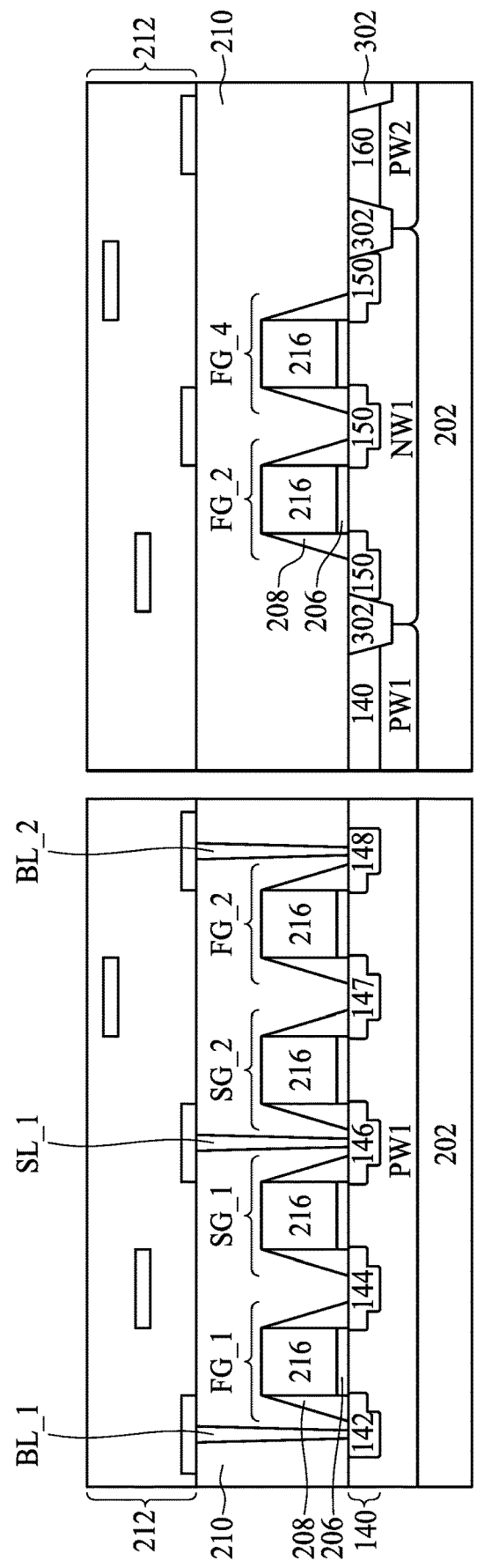

Referring to FIG. 8, an inter-level dielectric (ILD) layer 210 is formed on the semiconductor substrate 202 and the floating gates FG_1 to FG_4 and selector gates SG_1 to SG_4. The ILD layer 210 is formed by a suitable technique, such as chemical vapor deposition (CVD). For example, a high density plasma CVD can be implemented to form the ILD layer 210. The ILD layer 210 is formed on the semiconductor substrate 202 to a level above the top surface of the floating gates FG_1 to FG_4 and selector gates SG_1 to SG_4 such that the floating gates FG_1 to FG_4 and selector gates SG_1 to SG_4 are embedded in. In various embodiments, the ILD layer 210 includes silicon oxide, low-k dielectric material (dielectric material with dielectric constant less than about 3.9, the dielectric constant of the thermal silicon oxide).

In one embodiment, a chemical mechanical polishing (CMP) process is further applied to the ILD layer 210 to planarize the top surface of the ILD layer 210. The processing conditions and parameters of the CMP process, including slurry chemical and polishing pressure, can be tuned to partially remove and planarize the ILD layer 210. Next, a plurality of contact holes in the ILD layer 210 aligned with various contact regions and/or gate stacks may be formed by a lithography process and an etching process including one or more etching steps. The etching process is applied to etch the ILD layer 210 to expose the contact regions and/or gate stacks. The contact holes then are filled with one or more metal, resulting conductors BL_1, SL_1, and BL_2. In one embodiment, tungsten, copper or aluminum may be used to fill in the contact holes. The metal deposition can use physical vapor deposition (PVD), plating or combination thereof. Another CMP process may be applied to remove excessive metal layer formed on the ILD layer 210.

Next, the interconnect structure 212 is formed on the ILD layer 210. The interconnect structure 212 may include vertical interconnects, such as conventional vias or contacts, and horizontal interconnects, such as metal lines. The interconnect structure 212 may implement various conductive materials including copper, tungsten and silicide. In one example, a damascene process is used to form copper related interconnect structure 212. Although the memory device and formation of the memory device are described, other alternatives and embodiments can be present without departure from the scope of the present disclosure.

Some embodiments of the present disclosure provide a memory device, including: a first memory cell, including: a first transistor; a second transistor; and a first capacitor coupled to the second transistor; a second memory cell, including: a third transistor; a fourth transistor; and a second capacitor coupled to the fourth transistor; a third memory cell, including: a fifth transistor; a sixth transistor; and a third capacitor coupled to the sixth transistor; and a fourth memory cell, including: a seventh transistor; an eighth transistor; and a fourth capacitor coupled to the eighth transistor; wherein an electrode of the first capacitor, an electrode of the second capacitor, an electrode of the third capacitor, and an electrode of the fourth capacitor are electrically connected to a conductor.

Some embodiments of the present disclosure provide a memory device, including: a semiconductor substrate; a first well region of a first conductivity type in the semiconductor substrate; a second well region of a second conductivity type different from the first conductivity type in the semiconductor substrate; a third well region of the first conductivity type in the semiconductor substrate, wherein the second well region is between the first well region and the third well region; a first floating gate over the semiconductor substrate, the first floating gate overlapping the first well region and the second well region from a top view; a second floating gate over the semiconductor substrate, the second floating gate overlapping the first well region and the second well region from the top view; a third floating gate over the semiconductor substrate, the third floating gate overlapping the third well region and the second well region from the top view; and a fourth floating gate over the semiconductor substrate, the fourth floating gate overlapping the third well region and the second well region from the top view.

Some embodiments of the present disclosure provide a method of manufacturing a memory device, including: obtaining a semiconductor substrate; forming a first well region of a first conductivity type in the semiconductor substrate; forming a second well region of a first conductivity type in the semiconductor substrate; forming a third well region of the first conductivity type in the semiconductor substrate; and forming a plurality of floating gates over the semiconductor substrate, wherein the floating gates overlaps the second well region from a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a semiconductor substrate;
a first well region of a first conductivity type in the semiconductor substrate;
a second well region of a second conductivity type different from the first conductivity type in the semiconductor substrate;
a third well region of the first conductivity type in the semiconductor substrate, wherein the second well region is between the first well region and the third well region;
a first active area of the second conductivity type in the first well region;
a second active area of the second conductivity type in the second well region;
a first floating gate over the semiconductor substrate, the first floating gate overlapping the first well region and the second well region from a top view;
a second floating gate over the semiconductor substrate, the second floating gate overlapping the first well region and the second well region from the top view;
a third floating gate over the semiconductor substrate, the third floating gate overlapping the third well region and the second well region from the top view;
a fourth floating gate over the semiconductor substrate, the fourth floating gate overlapping the third well region and the second well region from the top view;
a first selector gate over the semiconductor substrate, the first selector gate overlapping the first well region from the top view;
a second selector gate over the semiconductor substrate, the second selector gate overlapping the first well region from the top view;
a first conductor arranged on the second active area, wherein the first conductor is electrically connected to a word line;
a second conductor arranged on the first selector gate, wherein the second conductor is electrically connected to a first selector line;
a third conductor arranged on the second selector gate, wherein the third conductor is electrically connected to a second selector line;
a fourth conductor arranged on the first active area, wherein the fourth conductor is between the first selector gate and the second selector gate, and the fourth conductor is electrically connected to a first source line;
a fifth conductor arranged on the first active area, wherein the first floating gate and the first selector gate is between the fifth conductor and the fourth conductor, and the fifth conductor is coupled to a first bit line; and
a sixth conductor arranged on the first active area, wherein the second floating gate and the second selector gate is between the sixth conductor and the fourth conductor, and the sixth conductor is coupled to a second bit line;

wherein the first floating gate and the second floating gate are symmetrical with each other across a first axis, and the first floating gate and the third floating gate are symmetrical with each other across a second axis, the first selector gate is separated from the second selector gate, and the first floating gate, the second floating gate, the third floating gate and the fourth floating gate overlaps the second active area, and the first conductor is arranged at an intersection of the first axis and the second axis on the second active area, and the fourth conductor overlaps the first axis.

2. The memory device of claim 1, further comprising:
a third selector gate over the semiconductor substrate, the third selector gate overlapping the third well region from the top view;
a fourth selector gate over the semiconductor substrate, the fourth selector gate overlapping the third well region from the top view;
a seventh conductor arranged on the third selector gate, wherein the seventh conductor is electrically connected to a third selector line; and
a eighth conductor arranged on the fourth selector gate, wherein the eighth conductor is electrically connected to a fourth selector line.

3. The memory device of claim 2, further comprising:
a third active area of the second conductivity type in the third well region;
a nineth conductor arranged on the third active area, wherein the nineth conductor is between the third selector gate and the fourth selector gate, and the nineth conductor is electrically connected to a second source line, and the nineth conductor overlaps the first axis;
a tenth conductor arranged on the second active area, wherein the third floating gate and the third selector gate is between the tenth conductor and the nineth conductor, and the tenth conductor is coupled to a third bit line; and
a eleventh conductor arranged on the second active area, wherein the fourth floating gate and the fourth selector gate is between the eleventh conductor and the nineth conductor, and the eleventh conductor is coupled to a fourth bit line.

4. The memory device of claim 3, wherein the first floating gate overlapping the second active area in a first overlapping area determining a capacitance of a first capacitor, the second floating gate overlapping the second active area in a second overlapping area determining a capacitance of a second capacitor, the third floating gate overlapping the second active area in a third overlapping area determining a capacitance of a third capacitor, and the fourth floating gate overlapping the second active area in a fourth overlapping area determining a capacitance of a fourth capacitor.

5. The memory device of claim 4, wherein the first floating gate is configured as a first electrode of the first capacitor, the second floating gate is configured as a first electrode of the second capacitor, the third floating gate is configured as a first electrode of the third capacitor, the fourth floating gate is configured as a first electrode of the fourth capacitor.

6. The memory device of claim 5, wherein the second active area is configured as a second electrode of the first capacitor, the second capacitor, the third capacitor, and the fourth capacitor.

7. The memory device of claim 2, wherein the first floating gate, the second floating gate, the third floating gate, the fourth floating gate, the first selector gate, the second selector gate, the third selector gate, and the fourth selector gate are discrete one from another.

8. The memory device of claim 1, further comprising:
a first isolation structure between the first well region and the second well region; and
a second isolation structure between the second well region and the third well region.

9. A method of manufacturing a memory device, comprising:
obtaining a semiconductor substrate;
forming a first well region of a first conductivity type in the semiconductor substrate;
forming a second well region of a second conductivity type in the semiconductor substrate;
forming a third well region of the first conductivity type in the semiconductor substrate, wherein the first well region are symmetrical with the second well region across a second axis;
forming a first active area of the second conductivity type in the first well region;
forming a second active area of the second conductivity type in the second well region;
forming a plurality of floating gates over the semiconductor substrate, wherein the floating gates overlaps the second well region and the second active area from a top view;
forming a first selector gate over the semiconductor substrate, wherein the first selector gate overlaps the first well region from the top view; and
forming a second selector gate over the semiconductor substrate, wherein the second selector gate overlaps the first well region from the top view, and the second selector gate is separated from the first selector gate, wherein the first selector gate and the second selector gate are symmetrical with each other across a first axis;
forming a first conductor at an intersection of the first axis and the second axis on the second active area, and electrically connecting the first conductor to a word line for reading and/or programing the memory device;
forming a second conductor on the first selector gate, and electrically connecting the second conductor to a first selector line;
forming a third conductor on the second selector gate, and electrically connecting the third conductor to a second selector line;
forming a fourth conductor on the first active area and electrically connecting the fourth conductor to a first source line, wherein the fourth conductor is between the first selector gate and the second selector gate, and the fourth conductor overlaps the first axis;
forming a fifth conductor on the first active area and electrically connecting the fifth conductor to a first bit line, wherein the first floating gate and the first selector gate is between the fifth conductor and the fourth conductor; and
forming a sixth conductor on the first active area and electrically connecting the sixth conductor to a second bit line, wherein the second floating gate and the second selector gate is between the sixth conductor and the fourth conductor.

10. The method of claim 9, further comprising:
forming a third selector gate over the semiconductor substrate, wherein the third selector gate overlaps the third well region from the top view; and
forming a fourth selector gate over the semiconductor substrate, wherein the fourth selector gate overlaps the third well region from the top view, and the fourth selector gate is separated from the third selector gate.

11. The method of claim 10, further comprising:
forming an interconnect structure over the semiconductor substrate.

12. A memory device, comprising:
a semiconductor substrate;
a first well region of a first conductivity type in the semiconductor substrate;
a second well region of a second conductivity type different from the first conductivity type in the semiconductor substrate;
a third well region of the first conductivity type in the semiconductor substrate, wherein the second well region is between the first well region and the third well region;
a first active area of the second conductivity type in the first well region;
a second active area of the second conductivity type in the second well region;
a first floating gate of a first memory cell over the semiconductor substrate, the first floating gate overlapping the first well region and the second well region from a top view;
a second floating gate of a second memory cell over the semiconductor substrate, the second floating gate overlapping the first well region and the second well region from the top view;
a third floating gate of a third memory cell over the semiconductor substrate, the third floating gate overlapping the third well region and the second well region from the top view;
a fourth floating gate of a fourth memory cell over the semiconductor substrate, the fourth floating gate overlapping the third well region and the second well region from the top view, wherein the first memory cell and the second memory cell are symmetrical with each other across a first axis therebetween, the third memory cell and the fourth memory cell are symmetrical with each other across the first axis therebetween, the first memory cell and the third memory cell are symmetrical with each other across a second axis therebetween, and the second memory cell and the fourth memory cell are symmetrical with each other across the second axis therebetween; and
a first conductor arranged at an intersection of the first axis and the second axis on the second active area, wherein the first conductor is electrically connected to a word line;
a fourth conductor arranged on the first active area and overlapping the first axis from a top view, wherein the fourth conductor is between the first floating gate and the second floating gate, and the fourth conductor is electrically connected to a first source line;
a fifth conductor arranged on the first active area, wherein the first floating gate is between the fifth conductor and the fourth conductor, and the fifth conductor is coupled to a first bit line; and
a sixth conductor arranged on the first active area, wherein the second floating gate is between the sixth conductor and the fourth conductor, and the sixth conductor is coupled to a second bit line;
wherein the first floating gate, the second floating gate, the third floating gate and the fourth floating gate overlaps the second active area.

13. The memory device of claim 12, further comprising:
a first selector gate over the semiconductor substrate, the first selector gate overlapping the first well region from the top view;
a second selector gate over the semiconductor substrate, the second selector gate overlapping the first well region from the top view;
a second conductor arranged on the first selector gate, wherein the second conductor is electrically connected to a first selector line;
a third conductor arranged on the second selector gate, wherein the third conductor is electrically connected to a second selector line.

14. The memory device of claim 13, further comprising:
a third selector gate over the semiconductor substrate, the third selector gate overlapping the third well region from the top view; and
a fourth selector gate over the semiconductor substrate, the fourth selector gate overlapping the third well region from the top view.

15. The memory device of claim 13, wherein the first floating gate, the second floating gate, the third floating gate, the fourth floating gate, the first selector gate, the second selector gate, the third selector gate, and the fourth selector gate are discrete one from another.

16. The memory device of claim 12, further comprising:
a first isolation structure between the first well region and the second well region; and
a second isolation structure between the second well region and the third well region.

17. The memory device of claim 12, further comprising:
a third active area of the second conductivity type in the third well region.

18. The memory device of claim 17, wherein the first floating gate overlapping the second active area in a first overlapping area determining a capacitance of a first capacitor, the second floating gate overlapping the second active area in a second overlapping area determining a capacitance of a second capacitor, the third floating gate overlapping the second active area in a third overlapping area determining a capacitance of a third capacitor, and the fourth floating gate overlapping the second active area in a fourth overlapping area determining a capacitance of a fourth capacitor.

19. The memory device of claim 18, wherein the first floating gate is configured as a first electrode of the first capacitor, the second floating gate is configured as a first electrode of the second capacitor, the third floating gate is configured as a first electrode of the third capacitor, the fourth floating gate is configured as a first electrode of the fourth capacitor.

20. The memory device of claim 19, wherein the second active area is configured as a second electrode of the first capacitor, the second capacitor, the third capacitor, and the fourth capacitor.

* * * * *